United States Patent
Metzger

(10) Patent No.: US 6,177,234 B1
(45) Date of Patent: Jan. 23, 2001

(54) PROCESS AND PREPARATION OF MONOCHROME AND POLYCHROMATIC COLOR PROOFS FROM HIGH RESOLUTION COLOR SEPARATIONS USING IMAGE CARRIERS HAVING A SPECIFIED ROUGHNESS

(75) Inventor: Bernhard Metzger, Darmstadt (DE)

(73) Assignee: E. I. du Pont de Nemours and Company, Wilmington, DE (US)

(*) Notice: Under 35 U.S.C. 154(b), the term of this patent shall be extended for 0 days.

(21) Appl. No.: 08/977,255

(22) Filed: Nov. 24, 1997

Related U.S. Application Data

(63) Continuation of application No. 08/457,951, filed on Jun. 1, 1995, now abandoned.

(30) Foreign Application Priority Data

Jun. 3, 1994 (DE) .................................. 44 19 597

(51) Int. Cl.⁷ .................................................. G03C 5/00
(52) U.S. Cl. ........................ 430/291; 430/292; 430/293; 430/271.1
(58) Field of Search .................... 430/291, 292, 430/293, 271.1

(56) References Cited

U.S. PATENT DOCUMENTS

| | | | |
|---|---|---|---|
| 3,582,327 | 6/1971 | Boyd et al. | 96/28 |
| 3,620,726 | 11/1971 | Chu et al. | 96/27 R |
| 3,649,268 | 3/1972 | Chu et al. | 96/27 R |
| 3,721,557 * | 3/1973 | Inoue | 430/293 |
| 4,215,193 | 7/1980 | Manger et al. | 430/291 |
| 4,243,741 | 1/1981 | Abele et al. | 430/270 |
| 4,346,162 | 8/1982 | Abele | 430/270 |
| 4,461,822 | 7/1984 | Abele | 430/97 |
| 4,596,757 | 6/1986 | Barton et al. | 430/257 |
| 4,604,340 | 8/1986 | Grossa | 430/270 |
| 4,734,356 | 3/1988 | Bauer et al. | 430/93 |
| 4,806,451 | 2/1989 | Fröhlich | 430/291 |
| 4,849,322 | 7/1989 | Bauer et al. | 430/285 |
| 4,892,802 | 1/1990 | Bauer et al. | 430/270 |
| 4,895,787 | 1/1990 | Platzer | 430/253 |
| 4,902,363 | 2/1990 | Delaney et al. | 156/230 |
| 4,939,029 | 7/1990 | Delaney et al. | 428/314.4 |
| 4,948,693 | 8/1990 | Shadrach et al. | 430/143 |
| 4,948,704 | 8/1990 | Bauer et al. | 430/291 |
| 4,950,577 | 8/1990 | Grieve et al. | 430/158 |
| 4,987,048 | 1/1991 | Shinozaki et al. | 430/166 |
| 5,049,476 * | 9/1991 | Platzer | 430/257 |
| 5,090,774 | 2/1992 | Dolla | 296/188 |
| 5,122,437 | 6/1992 | Matthews et al. | 430/291 |
| 5,155,005 * | 10/1992 | Sato et al. | 430/257 |
| 5,223,374 | 6/1993 | Mohr et al. | 430/257 |
| 5,240,810 | 8/1993 | Barjesteh | 430/257 |
| 5,275,912 | 1/1994 | Riley | 430/200 |
| 5,294,515 | 3/1994 | Wilczak et al. | 430/253 |
| 5,352,562 | 10/1994 | Takahashi et al. | 430/253 |
| 5,364,731 | 11/1994 | Shimizu et al. | 430/143 |
| 5,399,458 | 3/1995 | Grossa et al. | 430/257 |
| 5,401,603 | 3/1995 | Bodager et al. | 430/158 |
| 5,427,894 | 6/1995 | Metzger | 430/291 |
| 5,443,939 * | 8/1995 | Maerz et al. | 430/271 |
| 5,545,506 * | 8/1996 | Wilczak et al. | 430/257 |
| 5,547,811 * | 8/1996 | Maerz et al. | 430/257 |

FOREIGN PATENT DOCUMENTS

| | | | |
|---|---|---|---|
| 2096216 | 11/1993 | (CA) | G03F/7/027 |
| 0 443 802 A2 | 8/1991 | (EP) | G03F/3/10 |
| 0 487 797 A1 | 6/1992 | (EP) | G03F/3/10 |
| 0 514 186 A1 | 11/1992 | (EP) | G03F/3/10 |
| 0 644 459 A2 | 3/1995 | (EP) . | |
| 945807 | 1/1964 | (GB) . | |

* cited by examiner

Primary Examiner—Laura Weiner

(57) ABSTRACT

A monochromatic or polychromatic proof of a high resolution master and a process and means for its preparation are described. The graphic arts industry requires monochromatic or polychromatic proofs having high resolution and tonally correct reproduction of halftone masters having frequency modulated screen or line screens with more than 80 lines/cm. These proofs are obtained by using image carriers having image-side surfaces with an average roughness of 1.1 µm maximum. Such color proofs are necessary to check color separations in the graphic arts industry for whether subsequent printing results are a tonally correct reproduction of the master.

6 Claims, No Drawings

PROCESS AND PREPARATION OF MONOCHROME AND POLYCHROMATIC COLOR PROOFS FROM HIGH RESOLUTION COLOR SEPARATIONS USING IMAGE CARRIERS HAVING A SPECIFIED ROUGHNESS

This is a continuation of application Ser. No. 08/457,951 filed Jun. 1, 1995, now abandoned.

FIELD OF THE INVENTION

This invention relates to a process for making high resolution monochromatic and polychromatic proofs for the graphic arts industry and suitable image carriers enabling high resolution in the proof.

BACKGROUND OF THE INVENTION

Halftone color separations are used as copy originals for making offset and letterpress printing plates in reprographic processes. Before the printing plate is exposed, the color separation is proofed to determine whether the subsequent printing result will be a tonally correct reproduction of the original.

Such proofing processes use, for example, radiation-sensitive recording materials on which the image is produced by differences in the tackiness of the exposed and unexposed areas of the radiation-sensitive layer. Thus, for example, German Patent DE-C 12 10 321, U.S. Pat. No. 3,620,726, U.S. Pat. No. 3,582,327, U.S. Pat. No. 3,649,268, U.S. Pat. No. 4,356,253, and U.S. Pat. Nos. 4,948,704 and 4,243,741 disclose a reproduction process, wherein a tacky photopolymerizable material, comprising a support and a photopolymerizable layer containing at least one addition-polymerizable monomer and a photopolymerization initiator, is hardened by imagewise exposure. The exposed image areas lose their tackiness.

The latent image is made visible by the application of suitable toners that adhere only to the unexposed tacky areas and can be removed from the exposed hardened areas. This process yields a positive, optionally color, image of the original, similar in appearance to images prepared by the use of printing inks.

Negative images of the original are obtained by the use of photosensitive materials described, for example, in U.S. Pat. Nos. 4,243,741, 4,346,162, and 4,604,340. The photosensitive component of these recording materials is either a dihydropyridine compound or a system of a dihydropyridine compound and a hexaaryl bisimidazole compound.

The toners, comprising predominantly finely divided powders, can be applied by being dusted on the imagewise exposed surface, as described, for example, in U.S. Pat. Nos. 4,215,193 and 3,909,282. In another embodiment, the toners are loosely bonded on a special carrier and are transferred by bringing the carrier into contact with the imagewise exposed layer. Such pigmented carriers are described in U.S. Pat. Nos. 4,806,451 and 5,090,774.

The radiation-sensitive recording materials usually comprise a support, a radiation-sensitive layer, and a cover sheet. This cover sheet is stripped off, and the material is laminated on an image carrier before imagewise exposure. The support for the recording material can be stripped off before or after exposure depending on the material.

Standard line screens having a resolution of 60 lines per centimeter are currently used in reprography. Line screens having a resolution of 80 lines per centimeter are used for high quality printing. However, higher resolution screens are needed for especially high quality printing. Examples of such high resolution screens have 100 to 120 lines per centimeter or are frequency modulated screens which have very small equally sized spots that are randomly placed.

The use of high resolution screens, particularly frequency modulated screens, in reprography has been highly limited until now by a lack of suitable color proofing processes. The color proofing processes now on the market are not adequate to make monochromatic or polychromatic proofs corresponding to subsequent printing results. In particular, the very small dots in frequency modulated screens, having a dot diameter less than 25 $\mu$m and the 2% dots in line screens having a resolution above 80 lines per centimeter are not satisfactorily captured by current proofing processes. This yields color proofs that the expert designates as "uneven", "spotty", "hazy", or full of "mottle". Such color proofs are not suitable for testing printing masters.

Therefore, color proofing processes are required for modern planographic printing by the graphic arts industry for halftone color separations made with high resolution screens to enable proofing the preparation of printing plates.

Image carriers for color proofing processes are known to the expert. However, no image carriers for color proofing processes have been proposed until now to enable a true-to-the-original reproduction from high resolution halftone masters with a dot diameter of less than 25 $\mu$m.

The problem involved in this invention is to propose a color proofing process for preparing high resolution monochromatic and polychromatic proofs and to propose a process and image carrier for their preparation.

This problem is solved by monochromatic and polychromatic proofs according to the present invention, by image carriers for the preparation of such color proofs and by processes for the preparation of monochromatic and polychromatic proofs.

SUMMARY OF THE INVENTION

The invention provides monochromatic and polychromatic proofs, comprising an image carrier and applied thereon an imagewise colored and/or toned or an imagewise structured recording layer optionally containing a dye, characterized in that the image-side surface of the image carrier has an average roughness Rz of 1.1 $\mu$m maximum. Very small dots in frequency modulated screens, having a dot diameter less than 25 $\mu$m and the 2% dots in line screens having a resolution above 80 lines per centimeter are satisfactorily captured by using an image carrier has a maximum average roughness Rz of 1.1 $\mu$m.

The present invention also relates to an element comprising (a) an image carrier wherein the image carrier has at least one image-side surface; (b) a radiation-sensitive recording layer comprising a photopolymerizable layer containing at least one addition-polymerizable monomer and a photopolymerization initiator and an optional dye or a light-sensitive layer which changes tackiness upon exposure to radiation and an optional support wherein the image-side surface of the substrate has a maximum average roughness (Rz) of 1.1 $\mu$m. The element may optionally retain the support on the opposite side of the photopolymerizable recording material or light-sensitive material depending upon the supports transparency. If the support is opaque, it is removed before imagewise exposure through a high resolution master. If the support is transparent, it is peeled away after imagewise exposure through the high resolution master to form, in a positive, tonable, photopolymerizable system, an element comprising a substrate and an imagewise exposed recording layer containing a latent image with the exposed portion being non-tacky and the non-exposed portion retaining tackiness. The element further comprises a substrate and an imagewise exposed recording layer which, after application of toning materials or development of a recording layer containing colorants, dyes or pigments, forms a toned or colored image carrier. Removal of the toned material from the non-tacky exposed areas provides a proof according to the invention.

DETAILED DESCRIPTION OF THE INVENTION

The image carrier comprises an optionally composite substrate, which can have optional layers on the image receptor side and/or the opposite side. Such substrate layers can, for example, act as an antistat and/or adhesive, regulate optical dot growth, and/or influence surface properties, such as gloss and smoothness. The image carrier can have any number of layers. The layers can contain substances, such as dyes, fillers, optical brighteners, UV absorbers, and antistats. The image-side surface of the image carrier has a maximum average rougness of 1.1 $\mu$m. Preferably, the image-side surface of the image carrier has a maximum average roughness Rz of 0.6 $\mu$m. The most suitable image carrier has an average roughness Rz of less than 0.4 $\mu$m.

The present invention also relates to an element wherein the image carrier comprises a white-colored synthetic resin sheet 50 $\mu$m to 500 $\mu$m thick or a coated paper weighing between 50 g/m$^2$ and 500 g/m$^2$ or a combination of an optionally white-colored synthetic resin sheet and an optionally coated paper having a total thickness of 50 $\mu$m to 600 $\mu$m, and the radiation-sensitive recording layer, optionally containing a dye or colorant, comprises tonable or colorable radiation-sensitive mixtures comprising positive-tonable photohardenable materials or negative-tonable photohardenable materials. The invention further comprises an element wherein the positive-tonable photohardenable materials comprise a polymeric binder, at least one photopolymerizable compound, a photoinitiator and optional additives, and the negative-tonable photohardenable materials comprise materials containing a dihydropyridine compound or a photosensitive system comprising a hexaryl bisimidazole compound and a dihydropyridine. The invention also relates to an element as described above wherein the radiation-sensitive recording layer is imagewise-exposed to actinic radiation through a high-resolution halftone master and an element wherein the support is removed before imagewise exposure to the actinic radiation and to an element wherein toner is applied to the surface of the exposed recording layer in powder form or film form.

The present invention also comprises a monochromatic or polychromatic proof, comprising:
(a) an image carrier comprising a substrate with at least one image-side surface;
(b) an imagewise-exposed and toned, colored or structured and colored recording layer, wherein the image-side surface of the substrate has a maximum average roughness (Rz) of 1.1. $\mu$m.

The substrate for the proof is selected from double-sided flat supports of paper, cardboard, metals, sheets or plates of polymers.

The recording layer of said proof may comprise a polymeric binder, at least one photopolymerizable compound, a photoinitiator and optional additives. In one embodiment, the imagewise-exposed layer is hardened by exposure to actinic radiation.

The invention further relates to a process for making monochromatic and polychromatic proofs, comprising:
(a) applying a radiation-sensitive recording layer optionally containing a colorant or dye, optionally on a transparent or colored support layer, to an image carrier wherein the image carrier has an image-side surface with a maximum average roughness (Rz) of 1.1 mm and wherein the radiation-sensitive recording layer contacts the image-side surface of the image carrier;
(b) imagewise exposing the radiation-sensitive surface recording layer through a high-resolution master;
(c) developing the radiation-sensitive recording layer to form a developed recording layer;
(d) optionally repeating steps (a)–(c) to form an additional developed recording layer on the preceding developed recording layer.

The image carrier utilized in this process has an image-side surface with a maximum average roughness Rz of about 0.25 $\mu$m to about 0.37 $\mu$m and the substrate comprises a white-colored synthetic resin sheet 50 $\mu$m to 500 $\mu$m thick or a coated paper weighing between 50 g/m$^2$ and 500 g/m$^2$ or a combination of an optionally white-colored synthetic resin sheet and an optionally coated paper having a total thickness of 50 $\mu$m to 600 $\mu$m.

The invention also relates to a process for making monochromatic or polychromatic proofs wherein, after step (b) above, the process further comprises peeling the support layer from the radiation-sensitive recording layer.

Preferably, in said process, the image carrier has an image-side surface with a maximum average roughness Rz of about 0.25 $\mu$m to about 0.37 $\mu$m.

In the process wherein the support layer is peeled from the radiation-sensitive recording layer after step (b), the substrate comprises a white-colored synthetic resin sheet 50 $\mu$m to 500 $\mu$m thick or a coated paper weighing between 50 g/m$^2$ and 500 g/m$^2$ or a combination of an optionally white-colored synthetic resin sheet and an optionally coated paper having a total thickness of 50 $\mu$m to 600 $\mu$m.

The invention also relates to a process for making monochromatic or polychromatic proofs wherein, after step (a), and before step (b), the support is peeled away from the radiation-sensitive recording layer.

The invention further relates to a method of using a substrate in the preparation of monochromatic or polychromatic proofs wherein the substrate comprises an image carrier having an image-side surface wherein the maximum average roughness (Rz) on said surface is 1.1 $\mu$m and to a method wherein the maximum average roughness (Rz) on the image-side surface is about 0.25 $\mu$m to about 0.37 $\mu$m and wherein the substrate comprises a white-colored synthetic resin sheet 50 $\mu$m to 500 $\mu$m thick or a coated paper weighing between 50 g/m$^2$ and 500 g/m$^2$ or a combination of an optionally white-colored synthetic resin sheet and an optionally coated paper having a total thickness of 50 $\mu$m to 600 $\mu$m.

The expert determines the thickness of a suitable support from the mechanical requirements of each color proofing process and the demands of each segment of customers on the corresponding monochromatic or polychromatic color proofs thus prepared. The thickness of the image carrier is limited only by the requirements of each color proofing process and the end use of the color proof. The carriers described herein are analogous to image-receiving material described in for example, U.S. Pat. Nos. 4,948,704 or 4,892,802, except the image carrier must have a maximum average roughness (Rz) of 1.1 $\mu$m.

Examples of suitable substrates for the image carrier are double-sided flat supports of paper, cardboard, metals, sheets or plates of polymers, such as, for example, polyethylene, polyester, polyvinyl chloride, and polyamide. The substrate can also comprise more than one material. Examples of such are a paper bonded with a 175 μm thick polyester sheet. The substrate can be either transparent or opaque. It can contain pigments or can be dyed. Supports resistant to wash-off solutions are particularly well suited for preparing color proofs by a wash-off process.

Especially good substrates are white-colored synthetic resin sheets 50 μm to 500 μm thick, resin-coated papers weighing between 50 g/m² and 500 g/m², and combinations of optionally white-colored synthetic resin sheets with optionally coated papers having a total thickness of 50 μm to 600 μm. Examples of such substrates include polyethylene sheets and, in particular, polyethylene terephthalate sheets. Examples of such resins include polyethylene resins and polypropylene resins.

The image-side surface of an image carrier is characterized by the invention's average roughness Rz. One or both sides of the image carrier can be the image-side surface.

The average roughness Rz of an image carrier is measured, for example, according to DIN 4768, Sheet 1. Rz is the mathematical average of 5 single roughnesses of 5 adjacent single measure intervals which all have the same length ($Rz = \frac{1}{5}(z1+z2+z3+z4+z5)$). An example of a suitable measuring device is the Hommel Tester T20-DC attached to the sensor TKL 100 (Hommelwerke GmbH, D-7730 Schwenningen).

Color proofs can be prepared by the use of the image carrier of the invention in various color proofing processes. Examples of such processes are described in U.S. Pat. Nos. 5,364,731 (washoff and transfer process), 4,950,577 (washoff process), 4,596,757, 5,275,912, 4,461,822, and European Patent Applications EP-A 0 514 186, EP-A 0 570 815, EP-A 0 487 797, and EP-A 0 443 802.

Tonable radiation-sensitive mixtures useful in this invention can be positive, tonable, photohardenable systems, as disclosed, for example, in DE-C 12 10 321, U.S. Pat. No. 3,620,726 or U.S. Pat. No. 3,649,268, and negative tonable systems that become tacky when irradiated, as disclosed, for example, in U.S. Pat. Nos. 4,243,741, 4,346,162, and 4,604,340. These negative, tonable, recording materials contain either a dihydropyridine compound or a photosensitive system comprising a hexaaryl bisimidazole compound and a dihydropyridine.

Positive, tonable, photopolymerizable recording materials are preferred for use in this invention. The materials described in U.S. Pat. Nos. 4,734,356 & 4,849,322 and U.S. Pat. Nos. 4,892,802 and 4,948,704 are especially preferred. These materials contain a polymeric binder, at least one photopolymerizable compound, a photoinitiator, and optionally additives, such as plasticizers, sensitizers, fillers, antioxidants, and optical brighteners. Preferred binders are the polymers disclosed in U.S. Pat. Nos. 4,948,704 and 4,243,741, having a glass temperature <70° C. or <80° C. for polymer mixtures and having salt-forming groups crosslinked ionically by metal ions. Especially successful have been thermoplastic binders based on an acrylate and/or a methacrylate having salt-forming groups, for example, in the form of acrylic acid or methacrylic acid. Preferred metal ions are magnesium, calcium, strontium, barium, aluminum, tin, zinc, cadmium, titanium, zirconium, and manganese, which are added as salts, preferably chelates.

The tonable radiation-sensitive mixtures can be applied by known methods onto suitable, preferably transparent supports and subsequently dried. Examples of suitable supports are synthetic resin sheets of polyethylene, polypropylene, polyamide, and polyester. A polyethylene terephthalate sheet is preferred.

If an opaque support is used, it is stripped off before imagewise exposure.

The side of the recording layer away from the support is provided with a flexible cover layer, for example, a thin sheet of polystyrene, polyethylene, polypropylene, or polyethylene terephthalate. A polypropylene sheet is preferred.

The preferred thickness of the recording layer is between 2 μm and 100 μm. Thicknesses between 2 μm and 12 μm are especially preferred.

The radiation-sensitive material is most sensitive in the UV range, preferably in the wavelength range between 250 and 450 nm. Therefore, all radiation sources that can deliver an effective amount of this radiation are suitable for exposure, for example, xenon lamps, mercury vapor lamps, carbon arc lamps, lasers, fluorescent lamps having phosphors emitting UV radiation, and electronic flash devices.

The imagewise exposed recording layer can be toned by being dusted with a toner comprising predominantly finely divided powder, as disclosed, for example, in U.S. Pat. No. 4,215,193 and U.S. Pat. No. 3,909,282, and also by pigmented toning films containing the toner loosely bonded on a special carrier. Such toning films are described, for example, in U.S. Pat. No. 5,090,774, U.S. Pat. Nos. 4,806,451, 4,902,363 and 4,939,029.

The chief end use for the invention is in preparing monochromatic and polychromatic images for use in color proofing processes. Examples of such color proofing processes are described in U.S. Pat. Nos. 4,902,363 and 4,939,029 (positive-working peel-apart process), U.S. Pat. No. 5,352,562 (negative-working color transfer process), U.S. Pat. No. 5,240,810 (negative working washoff and transfer process), EP-A 05 14 186 (negative-working peel-apart process), U.S. Pat. No. 4,987,048, U.S. Pat. No. 3,671,236, U.S. Pat. No. 5,223,374 (washoff and transfer process), and U.S. Pat. No. 4,948,693 (positive-working washoff process).

Operating a color proofing process according to the present invention can, for example, include the following process steps:

Following removal of the cover sheet, a positive, tonable, photopolymerizable recording material is laminated (or otherwise applied, e.g., coated) on the image-side surface of an image carrier of the invention. The radiation-sensitive layer, either polymerized or unpolymerized, adheres more to the surface of the image carrier than to its own support and can, therefore, be readily removed.

The material is exposed with actinic radiation through its transparent support with a positive, halftone, color separation as the master or an opaque support is removed before exposure on that side. Non-tacky areas are formed on the exposed areas. The support is removed by delamination or equivalent step. The latent image produced on the image carrier is made visible by application of a toner that adheres only to the unexposed areas. The toner is removed from the hardened image areas, which are then completely free of toner. This yields a monochromatic proof of the master.

A polychromatic proof may also be formed by utilizing a series of subsequent steps wherein a second, third, or fourth photopolymerizable material is applied to the prior developed surface (after removal of the cover sheet of the photopolymerizable material to permit application to said surface). This material is then exposed under the same conditions through a color separation positive of a second color as the master, and toned. This step is repeated with a color separation of a third color and if desired, with a black separation.

Thus is obtained a polychromatic proof of the master.

The monochromatic or polychromatic proof can then be given a protective layer, comprising, for example, another laminate of photohardenable, radiation-sensitive material from which the support is removed after overall exposure.

The use of a color proofing process with a negative tonable material that becomes tacky on exposure is entirely analogous, except that negative color separations are used instead of positive color separations.

The invention will be further illustrated, but not limited, by the following examples.

EXAMPLES

Example 1

The average roughness Rz in μm of the image receptor surfaces of various image carriers was measured according to DIN 4768, Sheet 1, with a Hommel Tester T20-DC (Hommelwerke GmbH, D-7730 Schwenningen) using the sensor TKL 100.

A 4 μm thick, positive-working, tonable, photohardenable mixture, as described in U.S. Pat. Nos. 4,892,802 and 4,948,704 was laminated on the image-side surface of an image carrier as described below. In particular, a coating composition with the following components was used:

| | |
|---|---|
| methylene chloride | 113.0 g |
| methanol | 1.6 g |
| copolymer of methyl methacrylate, ethyl acrylate, acrylic acid (32/50/10 parts by weight), mw = 260000, Tg = 37° C. | 5.6 g |
| diacrylate ester of a bisphenol A--epoxy resin, obtained from bisphenol A and epichlorohydrin (viscosity = 1000000 cps) | 2.5 g |
| UV-reactive oligomer from trimethyl-olpropane triacrylate and hydrogen sulfide | 2.9 g |
| 2-o-chlorophenyl-4,5-bis(phenyl)-imidazolyl dimer | 0.2 g |
| 2-mercaptobenzoxazole | 0.1 g |
| copolymer of ethyl acrylate/acrylic acid (92/8 parts by weight), mw = 7000 | 2.4 g |
| 7-(4'-chloro-6'-diethylamino-1',3',5'-triazine-4-yl)-amino-3-phenylcumarin | 0.4 g |
| p-methoxyphenol | 0.003 g |
| zinc acetylacetonate (dissolved in 12 ml of a mixture of methylene chloride/methanol (5:1, v/v) | 0.4 g |

A coating solution as described above was applied to a polyethylene terephthalate film (12.5 μm) in such a way that, after drying, a 4 μm thick photopolymerizable film is obtained. This was then laminated onto the image carrier. The resulting image carrier further comprising the photohardenable mixture was exposed in an exposure device with actinic light through a halftone master. The halftone master was prepared by the usual process with frequency-modulated screens having a 14 μm dot diameter. The tacky areas were then toned with a cyan color film. The resulting color proofs were inspected for true reproduction of the master.

A true reproduction of a master has all the dots of the master in the proof. Table 1 shows the image carriers used and the proof results. V1 to V7 are known image carriers having a paper substrate for color proofing processes. E1 is a white, 250 μm thick, opaque polyethylene terephthalate sheet (Melinex® 347, ICI), E2 is an image carrier having a combination substrate of paper and a white polyethylene terephthalate sheet (175 μm thick Melinex® 347, ICI). The polyester sheet was on the image-bearing side of the image carrier.

TABLE 1

| Image Carrier Type/Status | Average Roughness [μm] | True Reproduction |
|---|---|---|
| V1 (CP 320-96, Du Pont) (Comparison) | 5.17 | No |
| V2 (CR/S-1, Du Pont) (Comparison) | 2.77 | No |
| V3 (LDG paper, Du Pont) (Comparison) | 2.47 | No |
| V4 (ES-96, Du Pont) (Comparison) | 1.20 | No |
| E1 (Melinex ®, 250 μm thick) | 0.25 | Yes |
| E2 (Melinex ® 347, 175 μm thick on CP 320-96) | 0.37 | Yes |
| V5 (3M Matchprint) (Comparison) | 3.03 | No |
| V6 (FUJI ColorArt) (Comparison) | 2.04 | No |
| V7 (AGFAPROOF) (Comparison) | 4.81 | No |

Example 2

A recording material and pigmented transfer films of cyan, magenta, yellow, and black were used to make a polychromatic color proof according to the following procedure as also described in DE 39 41 493 C1:

The cyan, magenta, yellow and black transfer layers required to make a four-color image were prepared by milling the quantities provided in Table 2 of pigment, binder, and surfactant in a bead mill with 40–60% of the necessary total solvent mixture of toluene, methyl ethyl ketone, and xylene (6:3:1). The remaining solvent is then added with vigorous stirring.

TABLE 2

| | Cyan (g) | Magenta (g) | Yellow (g) | Black (g) |
|---|---|---|---|---|
| Pigment | 52.50 | 80 | 35.0 | 50 |
| Amorphous SiO$_2$ | 15.00 | 50 | 8.0 | 40 |
| Ethylene/vinyl acetate copolymer 18% vinyl acetate, maximum tensile strength: 5.9 N/mm$^2$, according to ASTM D-882 | 80.55 | 116.75 | 56.0 | 107.4 |
| Anionic surfactant | 1.95 | 3.25 | 1.0 | 2.6 |
| Solvent | 850.0 | 750.0 | 900.0 | 800.0 |

A mixture of a cyan pigment based on copper phthalocyanine (C.I. 74160) and a magenta pigment (C.I. Pigment Red 123) was used for the cyan transfer layer, a mixture of two magenta pigments (C.I. Pigment Red 122 and Pigment Red 123) was used for the magenta transfer layer, and the pigment C.I. Pigment Yellow 17 was used for the yellow transfer layer. The transfer layer for black contained C.I. Pigment Black 7. The layer composition was applied with an 80 lines/cm screen at a printing rate of 150 m/min in direct gravure printing onto a 60 μm thick polypropylene foam sheet in accordance with German OS 37 06 528 so that, after drying, a 1 μm thick layer was obtained with a flawless surface without thickness variations. Corona treatment of the sheet was not required to increase surface tension.

The color density of each layer is:

Cyan: 1.30

Magenta: 1.40

Yellow: 1.30

Black: 1.70

After removal of the cover sheet, a 4 µm thick, positive-working, tonable, photohardenable layer as described in Example 1 was laminated onto an image carrier E1 from Example 1. This recording material was exposed for 42 seconds through a halftone, positive, cyan color separation in a vacuum copying frame with a metal halide lamp (3000 watts) having an ultraviolet-transparent filter at a spacing of 95 cm. After removal of the recording material support, the cyan transfer layer was laminated on the imagewise exposed layer and immediately peeled away. The transfer layer adhered only on the unexposed tacky areas, producing a positive cyan image of the master.

After removal of its cover sheet, a second, 4 µm thick, positive-working, tonable, photohardenable layer with a composition as described in Example 1 was laminated onto the cyan image and exposed as above through the corresponding halftone, magenta, color separation. After the recording material support was removed, a magenta transfer layer was laminated on the imagewise exposed layer and immediately peeled away. The transfer layer adhered only on the unexposed tacky areas, and a positive magenta image was obtained. The operating steps were repeated correspondingly for yellow and black, and a protective layer was applied in the usual manner. The result was a four-color proof having outstanding brilliance and sharpness with 1%–99% resolution in the 100 lines/cm screen, representing a true reproduction of the original. The adhesion of the recording layers on the image carrier was outstanding. The multicolor proof showed the required high resolution.

What is claimed is:

1. A process for making high resolution monochromatic or polychromatic proofs, comprising:
    (a) applying a radiation-sensitive recording layer, optionally containing a colorant or dye, to an image carrier wherein the image carrier has an image-side surface with a maximum average roughness ($R_z$) of about 0.25 to about 0.37 µm and wherein the radiation-sensitive recording layer contacts the image-side surface of the image carrier;
    (b) imagewise exposing the radiation-sensitive surface recording layer through a high resolution color separation selected from a frequency modulated screen having a dot diameter of less than 25 µm or a line screen with 2% dots having a resolution above 80 lines/cm;
    (c) developing the radiation-sensitive surface recording layer of step (b) to form a developed recording layer by selecting from the group consisting of developing the recording layer containing a colorant and applying a toner powder or a toner film when the recording layer does not contain a colorant;
    (d) optionally applying a second, third or fourth radiation-sensitive recording layer to the preceding developed recording layer and repeating steps (b)–(d); wherein the high resolution monochromatic or polychromatic proofs capture the dot diameter of the frequency modulated screen or the resolution of the line screen to form a high resolution monochromatic or polychromatic proof of said screen or screens.

2. A process according to claim 1, wherein the image carrier comprises a white-colored synthetic resin sheet 50 µm to 500 µm thick or a coated paper weighing between 50 g/m² and 500 g/m² or a combination of a white-colored synthetic resin sheet and a coated paper having a total thickness of 50 µm to 600 µm.

3. A process for making monochromatic or polychromatic proofs according to claim 1 wherein, in step (a) the radiation-sensitive recording layer further comprises a support layer on the surface of the recording layer opposite the surface that contacts the image-side surface of the image carrier and, after step (b), the process further comprises peeling the support layer from the radiation-sensitive recording layer.

4. A process according to claim 3, wherein the image carrier comprises a white-colored synthetic resin sheet 50 µm to 500 µm thick or a coated paper weighing between 50 g/m² and 500 g/m² or a combination of a white-colored synthetic resin sheet and a coated paper having a total thickness of 50 µm to 600 µm.

5. A process for making monochromatic or polychromatic proofs according to claim 1 wherein, in step (a) the radiation-sensitive recording layer further comprises a support layer on the surface of the recording layer opposite the surface that contacts the image-side surface of the image carrier and, after step (a), and before step (b), the support is peeled away from the radiation-sensitive recording layer.

6. The process according to claim 1 wherein the radiation-sensitive recording layer is present, at least during step (a), on a transparent or colored support layer, wherein the support layer is on the surface of the recording layer opposite the surface that contacts the image-side surface of the image carrier.

* * * * *